(12) United States Patent
Barraud et al.

(10) Patent No.: US 9,853,124 B2
(45) Date of Patent: Dec. 26, 2017

(54) METHOD FOR FABRICATING A NANOWIRE SEMICONDUCTOR TRANSISTOR HAVING AN AUTO-ALIGNED GATE AND SPACERS

(71) Applicant: Commissariat a L'Energie Atomique et aux Energies Alternatives, Paris (FR)

(72) Inventors: Sylvain Barraud, Le Grand Lemps (FR); Emmanuel Augendre, Montbonnot (FR); Sylvain Maitrejean, Grenoble (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/352,198

(22) Filed: Nov. 15, 2016

(65) Prior Publication Data

US 2017/0141212 A1    May 18, 2017

(30) Foreign Application Priority Data

Nov. 17, 2015 (FR) .................................. 15 61044

(51) Int. Cl.
*H01L 29/66* (2006.01)
*H01L 21/02* (2006.01)
(Continued)

(52) U.S. Cl.
CPC .. *H01L 29/66553* (2013.01); *H01L 21/02667* (2013.01); *H01L 21/3105* (2013.01);
(Continued)

(58) Field of Classification Search
CPC combination set(s) only.
See application file for complete search history.

(56) References Cited

U.S. PATENT DOCUMENTS 8,679,902 B1    3/2014 Basker et al.
2008/0135949 A1    6/2008 Lo et al.
(Continued)

OTHER PUBLICATIONS

French Preliminary Search Report dated Jul. 22, 2016 in French Application 15 61044 filed on Nov. 17, 2015 (with English Translation of Categories of Cited Documents0.
E. Bellandi, et al., "SiO2 Etch Rate Modification by Ion Implantation", Solid State Phenomena, XP008180910, vol. 195, 2012, 4 pgs.

*Primary Examiner* — Mamadou Diallo
(74) *Attorney, Agent, or Firm* — Oblon, McClelland, Maier & Neustadt, L.L.P.

(57) ABSTRACT

Method of making a transistor with semiconducting nanowires, including:
  making a semiconducting nanowire on a support, one portion of the nanowire being covered by a dummy gate, in which the dummy gate and the nanowire are surrounded by a dielectric layer,
  removing the dummy gate, forming a first space surrounded by first parts of the dielectric layer,
  making an ion implantation in a second part of the dielectric layer under said first portion, said first parts protecting third parts of the dielectric layer,
  etching said second part, forming a second space,
  making a gate in the spaces, and a dielectric portion on the gate and said first parts,
  making an ion implantation in fourth parts of the dielectric layer surrounding second portions of the nanowire, the dielectric portion protecting said first and third parts,
  etch said fourth parts.

14 Claims, 11 Drawing Sheets

(51) Int. Cl.
　　　*H01L 21/3105*　　(2006.01)
　　　*H01L 21/311*　　　(2006.01)
　　　*H01L 21/324*　　　(2006.01)
　　　*H01L 29/423*　　　(2006.01)
　　　*H01L 29/786*　　　(2006.01)
　　　*H01L 29/775*　　　(2006.01)
　　　*H01L 29/06*　　　　(2006.01)

(52) U.S. Cl.
　　　CPC ...... *H01L 21/31111* (2013.01); *H01L 21/324* (2013.01); *H01L 29/42392* (2013.01); *H01L 29/665* (2013.01); *H01L 29/66439* (2013.01); *H01L 29/66545* (2013.01); *H01L 29/66742* (2013.01); *H01L 29/775* (2013.01); *H01L 29/78618* (2013.01); *H01L 29/78696* (2013.01); *H01L 29/0673* (2013.01)

(56) References Cited

U.S. PATENT DOCUMENTS

| | | | |
|---|---|---|---|
| 2012/0319178 A1* | 12/2012 | Chang | B82Y 10/00 257/287 |
| 2013/0112937 A1* | 5/2013 | Bangsaruntip | B82Y 10/00 257/9 |
| 2013/0302955 A1 | 11/2013 | Vinet et al. | |
| 2014/0080276 A1 | 3/2014 | Brand et al. | |
| 2014/0203238 A1 | 7/2014 | Chang et al. | |
| 2014/0217509 A1* | 8/2014 | Chang | H01L 29/66545 257/350 |
| 2015/0270340 A1 | 9/2015 | Frank et al. | |
| 2017/0062598 A1* | 3/2017 | Seo | B82Y 10/00 |
| 2017/0076990 A1* | 3/2017 | Basker | H01L 29/66522 |

\* cited by examiner

METHOD FOR FABRICATING A NANOWIRE SEMICONDUCTOR TRANSISTOR HAVING AN AUTO-ALIGNED GATE AND SPACERS

TECHNICAL DOMAIN AND PRIOR ART

A method is disclosed for making a transistor with semiconducting nanowire(s) comprising a gate and self-aligned spacers This is particularly applicable to the manufacture of multiple gate transistors or multi-gate transistors, for example GAAFET ("Gate-All-Around Field-Effect Transistor" type transistors). This is particularly applicable to the domain of FET devices used for high performance and low consumption logic applications of microelectronics, and in the design and fabrication of FET transistors each comprising several nanowires superposed above each other, used in the design of integrated circuits with better electrical performances than circuits according to prior art.

Document US 2008/0135949 A1 describes a method of making an FET transistor with a channel composed of several superposed nanowires. This method starts by making a stack of semiconducting layers comprising an alternation of silicon layers and SiGe layers. When silicon is the material from which the nanowires will be formed, selective removal of SiGe relative to silicon is then applied at the region of the transistor channel so as to release silicon nanowires before the transistor gate is deposited around these nanowires.

With such a method, restrictive design rules must be applied to make it possible to release silicon nanowires while maintaining the structure. As a result of these design rules, the size of semiconductor blocks forming the source and the drain is large such that a high density of nanowires cannot be obtained. Moreover, it is difficult to achieve good positioning and a good definition of the gate pattern.

Documents U.S. Pat. No. 8,679,902 B1 and EP 2 654 083 A1 describe other methods of making transistors in which the channels comprise superposed nanowires and are provided with a gate all around the nanowires. In these documents, the gate is formed using a damascene type method (approach known as "Gate-Last" or "Replacement Metal Gate" (RMG)), in which:

the first step is to form a dummy gate by covering a stack of alternating silicon layers and SiGe layers, in the channel region, and then gate spacers and source and drain regions are produced, and then the dummy gate is then etched through a masking layer covering the entire structure, this etching also eliminating the SiGe (when SiGe is used as the sacrificial material and the channel will be formed from silicon nanowires) at the transistor channel region to form the nanowires, and finally the definitive gate is made in the space formed by etching the dummy gate.

The disadvantage of such an approach is the etching applied to eliminate SiGe at the channel region does not stop in line with the opening formed in the masking layer for removal of the dummy gate; this etching propagates towards the source and drain regions. During selective removal of SiGe relative to silicon, there is no self-alignment of the removed SiGe with the location defined to form the gate. Consequently, the final gate deposited after these sacrificial layers have been removed is not self-aligned with the volume formed solely by removal of the dummy gate. This leads to an increase in parasite capacitances within the transistor because when gate materials fill the cavity, some areas at the edge of the gate overlap the source and drain regions.

PRESENTATION OF THE INVENTION

Therefore there is a need to disclose a method of making a transistor with at least one semiconducting nanowire and a self-aligned all-around-gate or partially-around-gate, with internal spacers placed between the gate and the source and drain regions, such that transistors can be made at high density on the support and without the disadvantages of methods according to prior art described above.

One embodiment achieves this by using a method of making at least one transistor with at least one semiconducting nanowire, including at least:

a) making at least one first semiconducting nanowire on a support, a first portion of the nanowire intended to form part of a transistor channel being partially covered by a dummy gate, the dummy gate and the first nanowire being surrounded by a first dielectric layer, b) removal of the dummy gate, forming a first free space around which first parts of the first dielectric layer are arranged, c) first ion implantation in at least one second part of the first dielectric layer located between the first portion of the first nanowire and the support, the first parts of the first dielectric layer protecting third parts of the first dielectric layer from this first ion implantation, d) selective etching of the second part of the first dielectric layer, forming a second free space, e) making a gate in the first and second free spaces, and a dielectric portion located on the gate and on the first parts of the first dielectric layer, f) second ion implantation in fourth parts of the first dielectric layer surrounding the second portions of the first nanowire intended to form part of the transistor source and drain regions, the dielectric portion protecting the first and third parts of the first dielectric layer from this second ion implantation, g) selective etching of the fourth parts of the first dielectric layer.

Therefore with this method, the third parts of the first dielectric layer form spacers located between the first nanowire and the support, and also between nanowires when the transistor comprises several nanowires, preventing the deposition of gate materials in the source and drain regions of the transistor.

During implementation of this method, the nanowire(s) is (are) not etched so as to keep only the part(s) of the nanowires that will form the transistor channel, thus preventing loss of the stress present in the channel that would be due to the presence of free edges around these parts of the nanowire(s).

In this method, the spacers formed from the third portions of the first dielectric layer are defined to be self-aligned by means of ion implantations used during which the first parts of the first dielectric layer and the dielectric portion mask these third portions of the first dielectric layer from these ion implantations that define the parts of the dielectric layer to be eliminated. Thus, spacers formed by these third portions of the first dielectric layer are well aligned with the gate spacer formed by the first parts of the first dielectric layer, the gate also being well aligned with the part of the nanowire(s) forming the transistor channel.

Finally, since parts of the nanowire(s) are kept to make source and drain regions, production of these regions, for example by epitaxy, is not critical due to the exposed semiconductor surface of these parts of the nanowire(s), thus preventing the formation of defects in the semiconductor of the source and drain regions.

This method can also be used to make one or several transistors formed from several nanowires, or several assemblies of superposed nanowires, arranged side by side at a high density, for example at a repetition pitch of between 30 nm and 40 nm.

This method can be used to make GAAFET type transistors, advantageously with gate lengths less than about 20 nm.

This is advantageously applicable for the fabrication of transistors used to make integrated circuits for high performance low consumption logic applications of microelectronics: NAND type flash memory, molecular memory, load sensor type applications.

The method can be applied to any structure requiring self-alignment of a gate with one or several nanowires suspended above a support.

The second part of the first dielectric layer is located between the third parts of the first dielectric layer.

The first dielectric layer surrounding the dummy gate and the first nanowire may include at least one dielectric material with a dielectric permittivity of less than or equal to 7. This can reduce parasite capacitances and therefore increase the operating speed of a CMOS circuit including such transistors.

The method may also include implementation of the following steps between steps a) and b):
  deposition of a second dielectric layer covering the assembly comprising the support, the first nanowire, the dummy gate and the first dielectric layer,
  planarization of the second dielectric layer stopping on the first dielectric layer,
  and in which parts of the second dielectric layer covering the fourth parts of the first dielectric layer are removed between the gate making step and the second ion implantation step.

In this case, the dielectric portion can advantageously be made in a third free space formed in the second dielectric layer. The second dielectric layer makes it easy to make the dielectric portion locally on the gate and on the first portions of the first dielectric layer.

The method can be used for more than two nanowires superposed above each other.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Refer firstly to FIGS. 1 to 20 that show the steps in a particular embodiment of a method for collectively making two transistors 100, in this case of the GAAFET type. However, these steps can be applied in a similar manner to make a single transistor 100.

Figure 1:
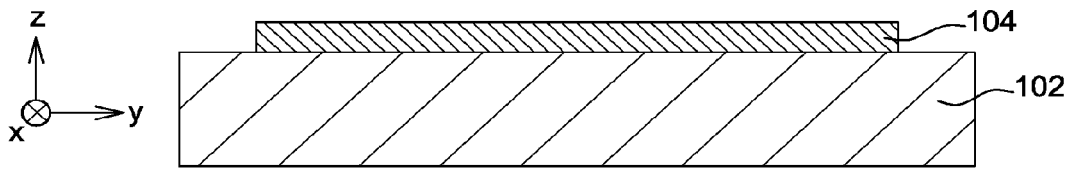
FIGS. 1 to 20 show the steps in a method of making semiconductor nanowire transistors according to one particular embodiment.
Figure 2:
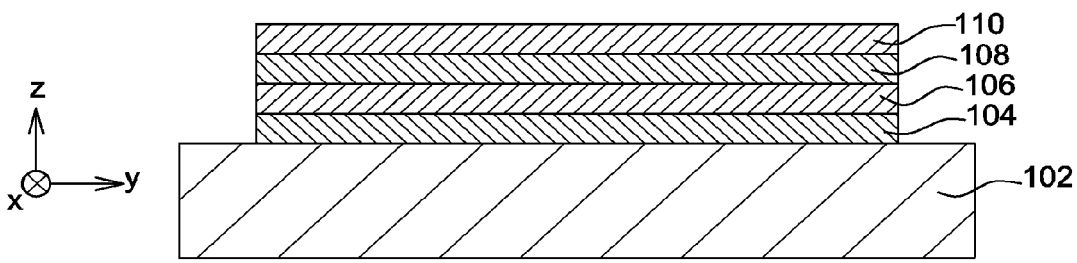
Figure 3:
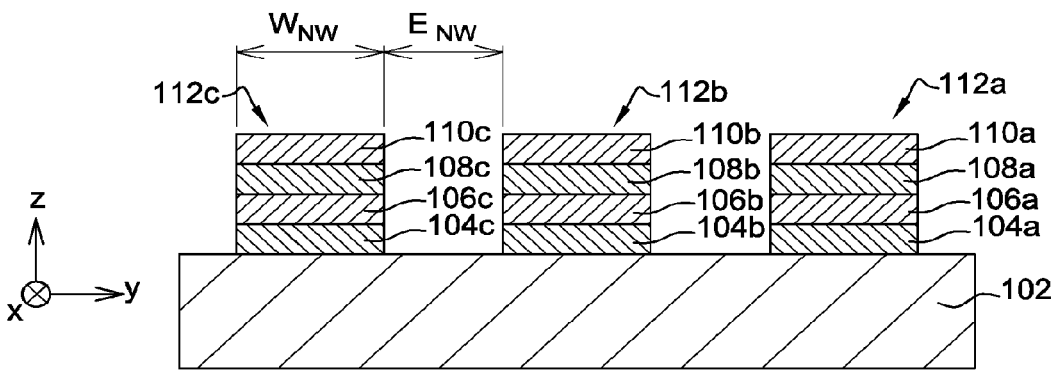
Figure 4A:
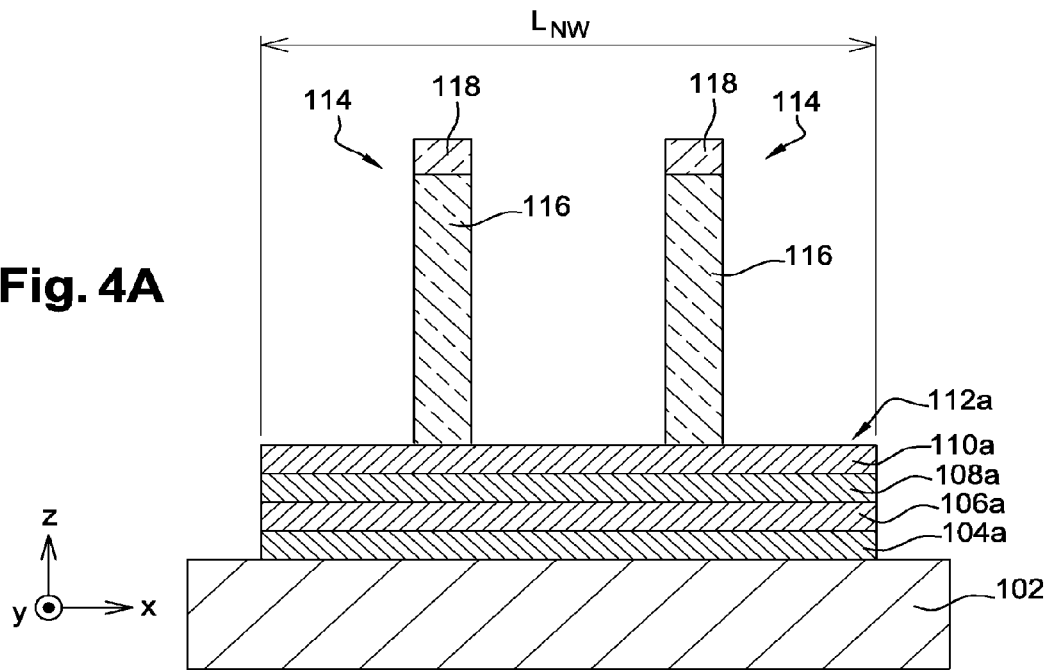
Figure 4B:
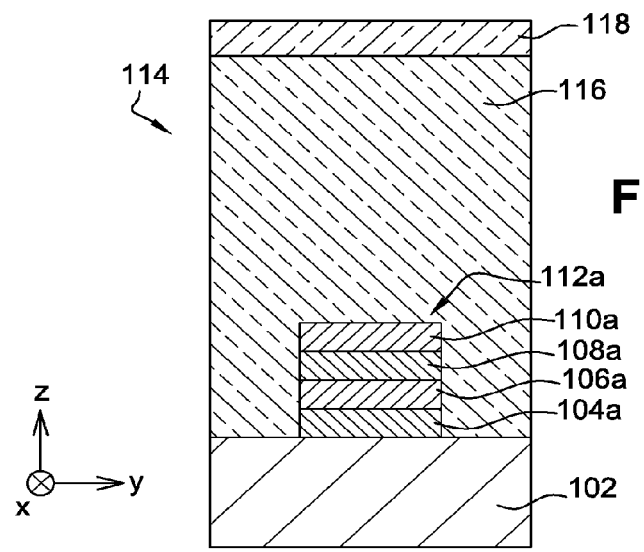

The transistors 100 are made from a semiconductor substrate that can be bulk or solid, for example comprising silicon, or of the Semiconductor on Insulator type (for example SOI or <<Silicon-On-Insulator>>, SiGeOI or <<Silicon-Germanium-On-Insulator>>, etc.). The substrate in the particular embodiment described herein is an SOI type substrate. FIG. 1 shows a buried dielectric layer 102 or BOX ("Buried-Oxide") in the SOI substrate, this layer 102 being covered by a surface layer 104 in this case comprising silicon. The surface layer 104 may for example be about 7 nm thick, and this thickness can vary between about 5 nm and 10 nm. The thickness of the surface layer to make transistors 100 that will have a gate length between about 15 nm and 16 nm may be between about 6 nm and 7 nm. For example the thickness of the layer 102 is between about 20 nm and 700 nm, for example equal to about 145 nm.

The surface layer 104 is then covered with a second layer 106 comprising a material corresponding to the semiconductor that will form the nanowires of the transistor, in this case SiGe. The material of the surface layer 104 is such that it can be selectively etched relative to the semiconductor in the second layer 106. The thickness of the second layer 106 may for example be equal to about 8 nm, and may be between about 2 nm and 50 nm. One or several other stacks of layers similar to the stack formed from layers 104 and 106 are then made on the second layer 106, depending on the number of superposed nanowires that will be made for the transistors 100. In the example in FIG. 2, a single additional stack is formed from a third layer 108 comprising the same material as the surface layer 104, in this case silicon, and a fourth layer 110 comprising the same material as the second layer 106, in this case SiGe, is made on the second layer 106. The thickness of the third layer 108 may for example be similar to the thickness of the surface layer 104, and the thickness of the fourth layer 110 may for example be similar to the thickness of the second layer 106. The thicknesses of layers 106 and 110 correspond to the thicknesses of the nanowires of transistors 100 that will be made later, and the thicknesses of the layers 104 and 108 are the thicknesses of the spaces that will separate the nanowires superposed on each other and the space between the substrate and the first nanowire. In general, the transistors 100 may be made from a number of stacks of layers between about 1 and 20, to make between about 1 and 20 superposed semiconducting nanowires. For example, the layers 106, 108 are 110 are made by epitaxy.

According to a first variant, the material in the layers 104 and 108 may be silicon and the material in the layers 106, 110 may be $Si_{1-X}Ge_X$, where X is such that $0.05<X<1$. According to a second variant, the material in layers 104 and 108 may be $Si_{1-X}Ge_X$, where X is such that $0.05<X<1$, and the material of layers 106, 110 may be silicon so as to form silicon nanowires.

The layers 104 to 110 are then etched, for example by lithography and "spacer patterning" type etching, or indirect decomposition printing, in order to form one or several distinct stacks such that one or several superposed nanowires can be made from each of the stacks arranged adjacent to each other on layer 102. On the example in FIG.

3, three stacks 112a, 112b, 112c are formed, each comprising a portion of each of the layers 104, 106, 108, 110. Thus, each transistor 100 for which fabrication is described herein will have six semiconducting nanowires arranged to form three groups of nanowires, these groups being located side by side on the dielectric layer 102, and each group of nanowires comprising two nanowires with one superposed above the other. In general, each transistor 100 may comprise between about 1 and 10 groups of superposed nanowires.

The width $W_{NW}$ of each stack 112 (dimension parallel to the Y axis), that also corresponds to the width of the nanowires of the transistors 100 that will be made from these stacks 112, is for example between about 10 nm and 50 nm and for example equal to about 20 nm. The space $E_{NW}$ between two adjacent stacks 112 (dimension parallel to the Y axis), that also corresponds to the space between two adjacent nanowires or two groups of adjacent nanowires of each transistor 100, may for example be between about 20 nm and 40 nm so as to obtain a high density of nanowires on the layer 102. As a variant, this space $E_{NW}$ may be more than about 40 nm, or even more than about 1 μm. The length $L_{NW}$ (dimension shown on FIG. 4A and parallel to the X axis) of each of the stacks 112, that also corresponds to the length of the nanowires from which the transistors 100 are made, is for example between about 40 nm and 1 μm.

The remainder of the process for making the transistors 100 is described with reference to FIGS. 4A to 20 on which stack 112a only is shown, to make it easier to understand the drawings. However, the following steps described and used with reference to stack 112a are also used for stacks 112b and 112c.

A dummy gate 114 is then made for each transistor 100 on part of the upper faces of stacks 112 and on part of the lateral flanks of stacks 112, thus defining the future location of the gates of transistors 100. Each dummy gate 114 shown in the example of FIGS. 4A and 4B may comprise a portion 116, for example comprising an $SiO_2$/polysilicon stack. On FIG. 4B, only one of the portions 116 is shown, and only the part of this portion 116 that covers the stack 112a is shown. However, each of the portions 116 forms a continuous portion covering part of each of the stacks 112.

These portions 116 are for example obtained firstly by making a conforming deposit (forming a layer with approximately constant thickness) of $SiO_2$ with a thickness for example between about 2 nm and 6 nm, followed by a deposit of polysilicon forming a layer with a thickness between about 50 nm and 200 nm. A mask 118, for example comprising silicon nitride with a thickness for example equal to about 40 nm and with a pattern corresponding to the pattern of the portion(s) of the dummy gate(s) 114 is then deposited on the polysilicon layer, the polysilicon and $SiO_2$ layers are then etched according to the pattern defined by mask 118.

Figure 5A:
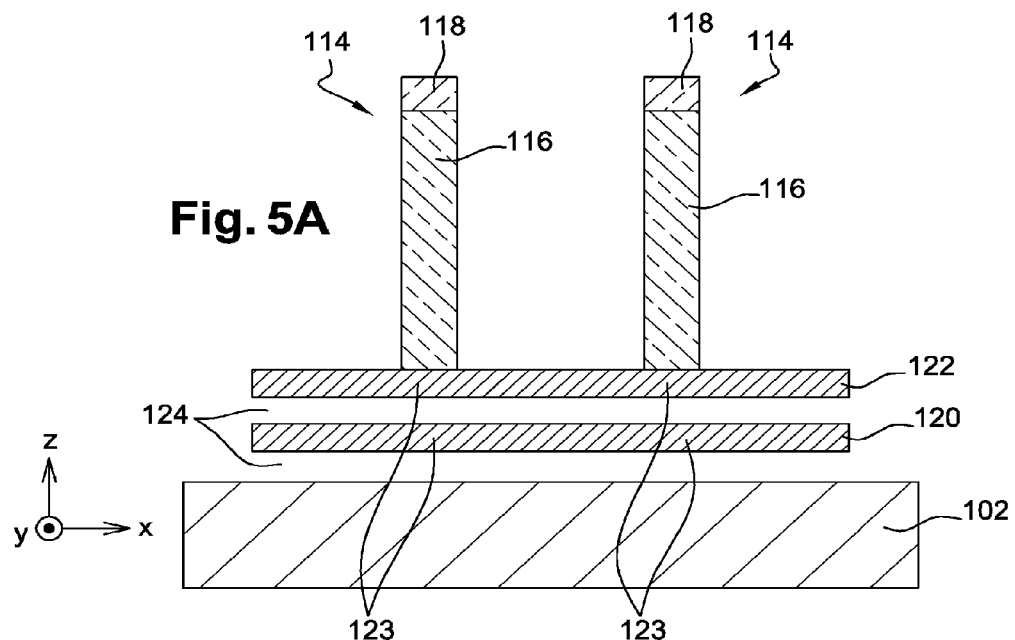
Figure 5B:
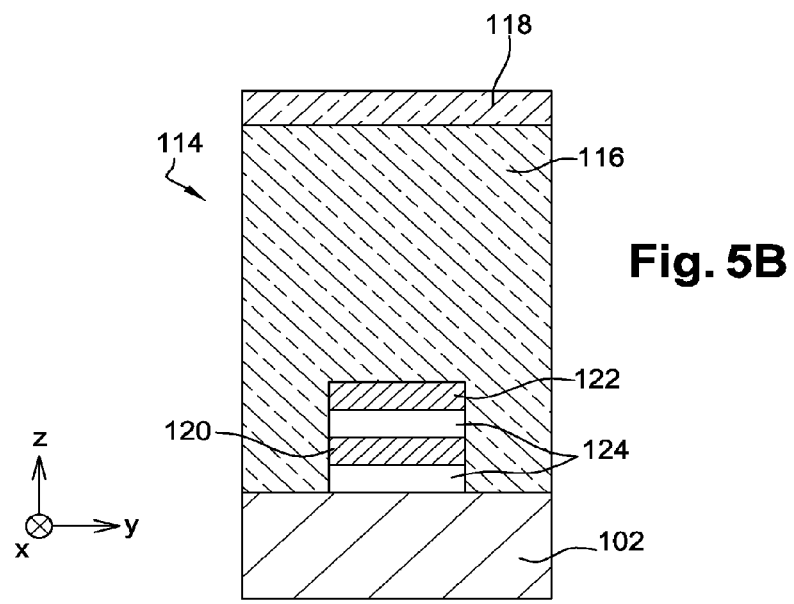

In each of the previously made stacks 112, the portions of the layers 104 and 108 are then selectively etched relative to the portions of layers 106 and 110 that then form nanowires 120 and 122 of SiGe superposed above each other, for each of the previously made stacks 112. The first nanowire 120 is suspended above the dielectric layer 102 and the second nanowire 122 is suspended above the first nanowire 120 (FIGS. 5A and 5B).

This etching of portions of layers 104 and 108 forms a space 124 around the nanowires 120, 122. The nanowires 120, 122 are held in the suspended state by the dummy gate 114 which is in contact with them. The portions 116 are located above the first portions 123 of the nanowires 120, 122 that will form part of the channels of transistors 100.

Figure 6:
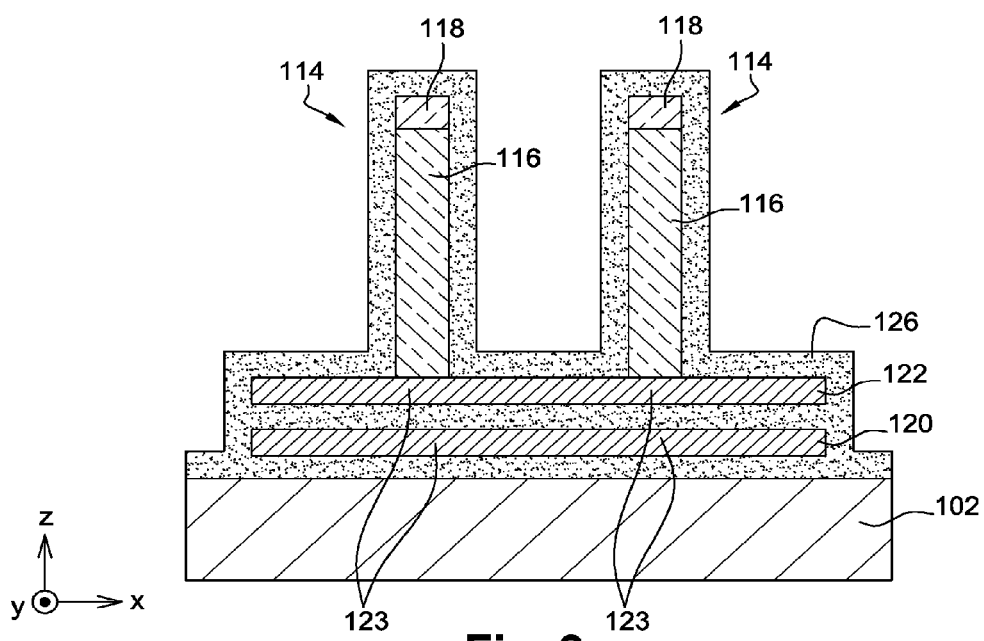

A first dielectric layer 126 is then deposited in a conforming manner on the previously made structure (FIG. 6). The material in this layer 126 is deposited in particular in the space 124 previously formed by etching portions of layers 104 and 108, thus completely surrounding the nanowires 120, 122 except at the parts of these nanowires in contact with the dummy gate 114. The dielectric material of the layer 126 in this case is a dielectric for which the dielectric permittivity is advantageously less than or equal to about 7, or for example semiconducting nitride such as SiN.

Figure 7:
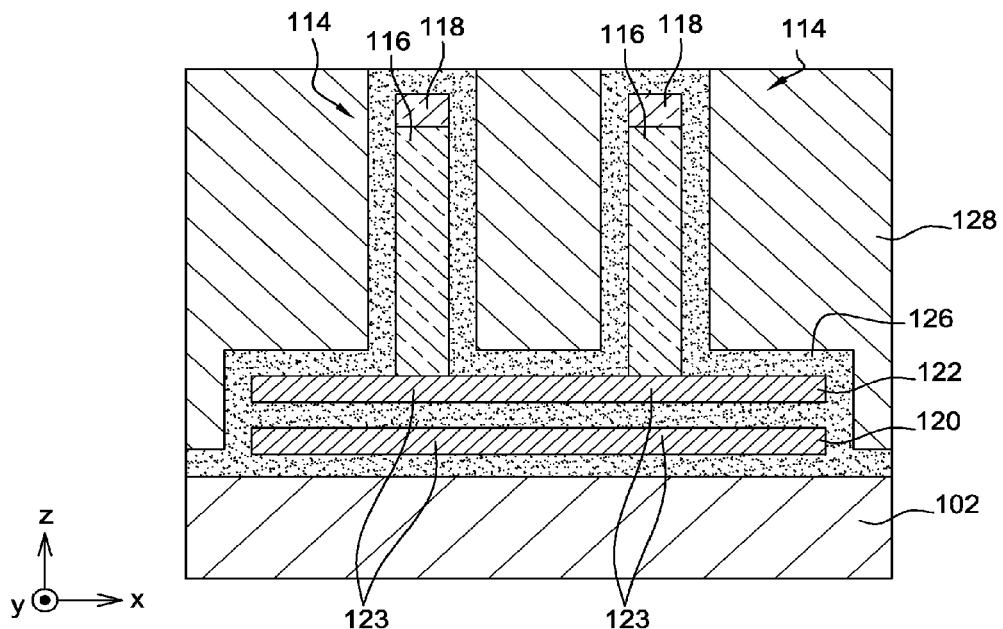

As shown on FIG. 7, a second dielectric layer 128, in this case comprising a semiconducting oxide, covering the entire previously made structure is then deposited and planarized by CMP (chemical mechanical planarization) stopping on parts of the layer 126 that cover the mask 118.

Figure 8:
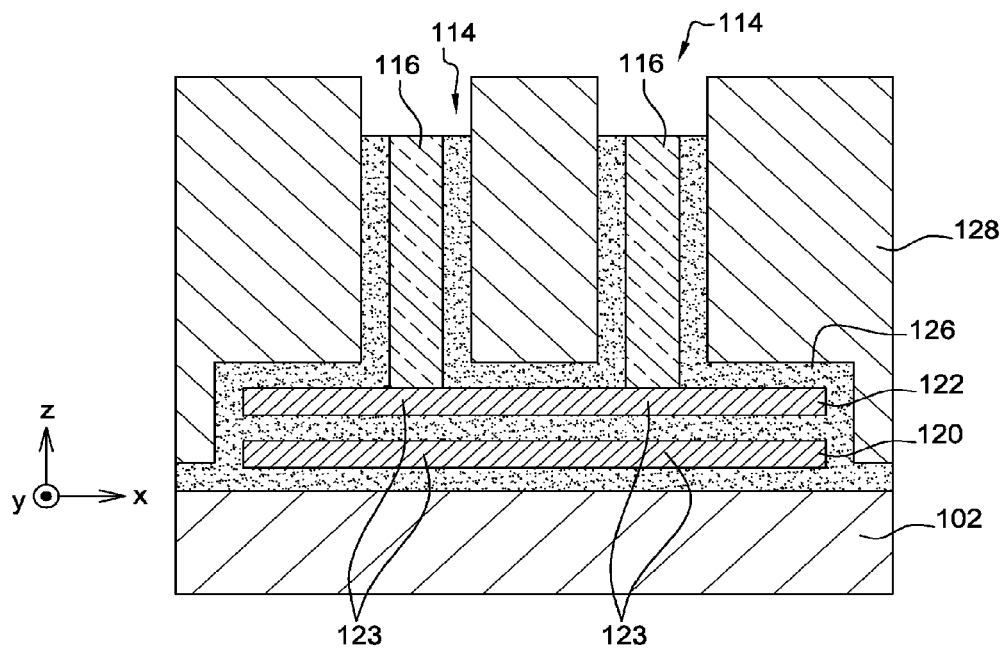

The mask 118 and the parts of the layer 126 located on and at the side of the mask 118 are eliminated by etching, for example using an $H_3PO_4$ type chemical etching (FIG. 8). This etching provides access to portions 116 of the dummy gates 114.

Figure 9:
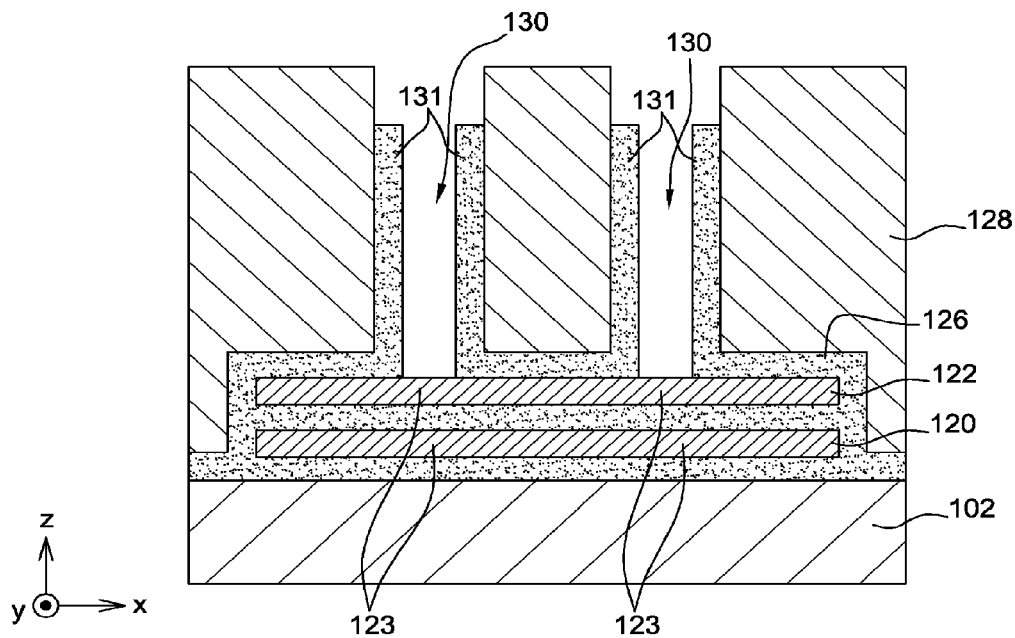

The dummy gates 114 are then removed, for example through the use of a TMAH type chemical etching, thus creating first free spaces 130 around which the first parts 131 of the layer 126 are deposited and forming the locations of the final gates of transistors 100 (FIG. 9).

Figure 10:
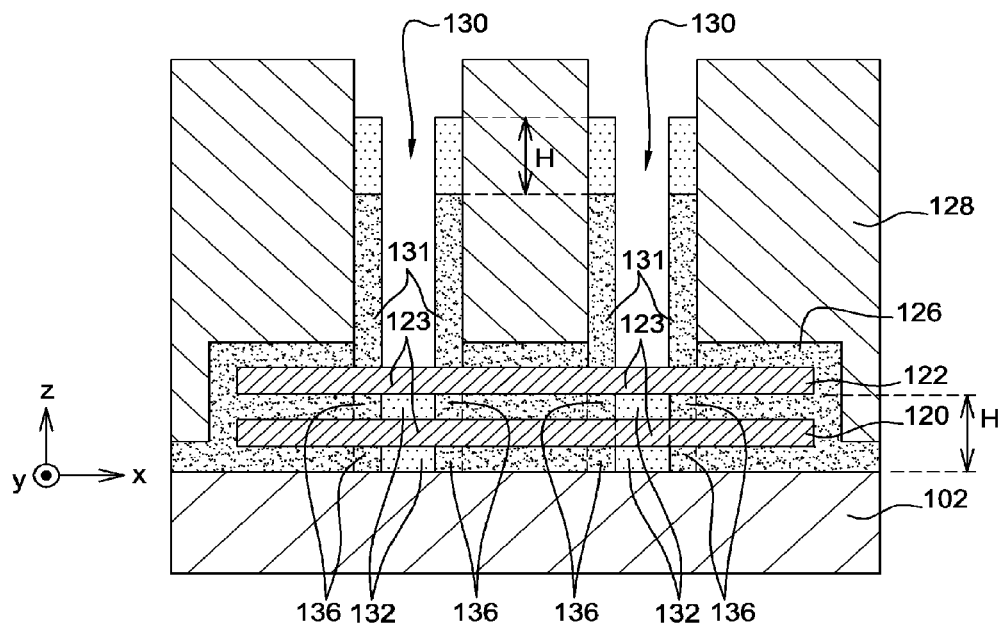

As shown on FIG. 10, a first ion implantation is then carried out such that this ion implantation is applied to second parts 132 of the layer 126 aligned with the first free spaces 130 between and under the nanowires 120, 122, and the nature of these second parts 132 is modified. The dimension "H" shown on FIG. 10 illustrates the depth to which this implantation is made, and in this case corresponds to the sum of the thicknesses of layers 104, 106 and 108. More generally, the ion implantation is performed such that the ion implantation is made up to this depth H that is equal to the sum of all the layers in the stack used to make nanowires, except for the last layer in the stack (the layer at the top of the stack) used to form the last nanowire, in other words the nanowire arranged above the other nanowires. This first ion implantation makes it possible for the second parts 132 of the layer 126 to be etched selectively relative to the rest of the layer 126 because the material on which this ion implantation is made is etched faster than the material that was not implanted.

This ion implantation is applied partially to the first parts 131 along the lateral walls of the spaces 130. Considering that the height of the first parts 131 of the layer 126 covering the side walls of the first free spaces 130 is more than the ion implantation depth H, this ion implantation is only made on a part of the first parts 131 of the layer 126.

Furthermore, this ion implantation is not applied to the third parts 136 of the layer 126 located in the space 124, adjacent to the second parts 132 and aligned with the first parts 131 due to the protection provided by the first parts 131 of the layer 126 covering the side walls of the first free spaces 130, ions directed in line with the third parts 136 being implanted in the upper portions of the first parts 131. Furthermore, the remainder of the layer 126 is protected from this ion implantation by the dielectric layer 128 that covers the other parts of the layer 126.

The implantation used can correspond to an ion beam or plasma implantation.

The gas used for a plasma implantation may comprise lightweight atoms such as for example dihydrogen or $H_2$, so that the semiconductor of nanowires 120, 122 is not changed by this ion implantation and keeps its crystalline structure. The lightweight atoms may correspond to atoms capable of modifying the crystalline structure of the dielectric material of the layer 126 without making the semiconductor of the nanowires 120, 122 amorphous. The ion implantation may be made in a plasma by inductive or capacitive coupling, or by immersion. The modification to the chemical nature of the material of the parts of the layer 126 in which ions are implanted is a volume change, leading to a higher concentration of species implanted on the surface of these parts. For example, if such a plasma implantation is made over a height H equal to about 28 nm, the ion implantation can be done in a capacitively coupled plasma (CCP) reactor with the following parameters:

gas used: $H_2$,
flow equal to about 50 sccm (<<standard cubic centimetres per minute>>),
ion energy equal to about 300 W,
power of the ion emission source equal to about 800 W,
pressure equal to about 50 mTorr.

In the case of an ion beam implantation, different types of ions can be used, for example such as argon, fluorine or hydrogen type ions. Advantageously, two successive ion beam implantations can be applied to obtain good positioning of the dose of ions implanted in the required portions of material. For example, to make an ion implantation in the second parts 132 with thickness equal to about 7 nm, the nanowires 120, 122 also being about 7 nm thick, a first ion implantation by an Ar ion beam with a power equal to about 5 keV with a concentration equal to about $10^{15}$ cm$^{-3}$ is used, followed by a second ion implantation by an Ar ion beam with a power equal to about 15 keV with a concentration equal to about $10^{15}$ cm$^{-3}$.

With an ion beam implantation, it is possible that the semiconductor of parts of nanowires through which the ion pass passes has become at least partially amorphous. In this case, after the ion implantation, annealing is possible to recrystallize the semiconductor of these parts of the nanowires 120, 122, such as a spike type annealing, for example at a temperature of about 1050° C.

Figure 11:
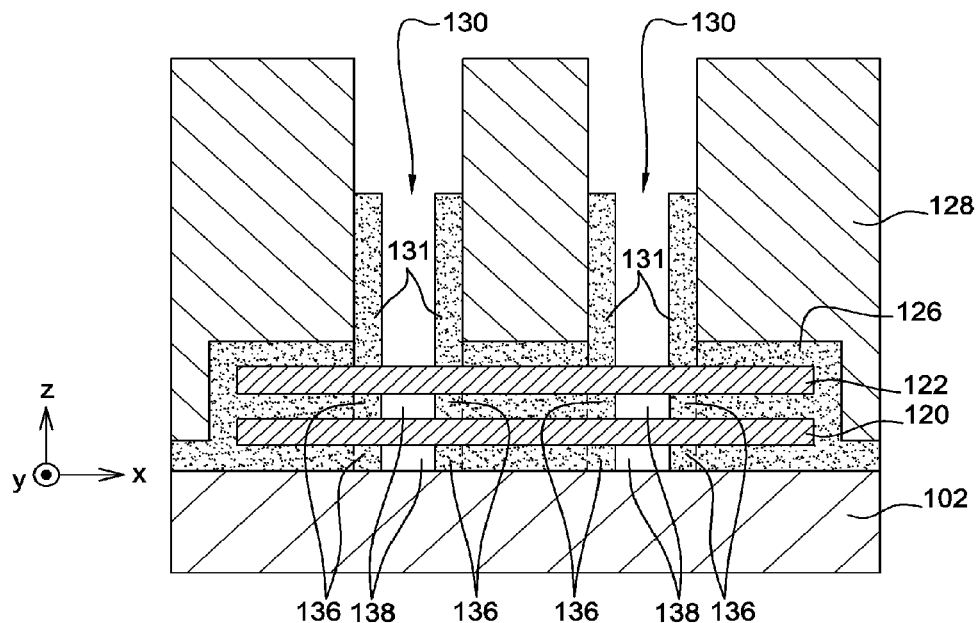

The parts 132 and the upper portions of the first parts 131 of the layer 126 in which ions were implanted are subsequently removed, for example by wet etching using a 1% HF solution, thus etching these parts of the dielectric material implanted selectively relative to the semiconductor of the nanowires 120, 122 and relative to the dielectric material of the other parts of the layer 126 on which no ion implantation was made (FIG. 11). This removal forms second free spaces 138 around parts of the nanowires 120, 122 that were previously in contact with the second parts 132. Furthermore, due to the protection provided by the first parts 131 of the layer 126 and by the layer 128, these second free spaces 138 are perfectly aligned with the first free spaces 130, so that the gates of transistors 100 can be made without being partly located in the source and drain regions of transistors 100.

Figure 12:
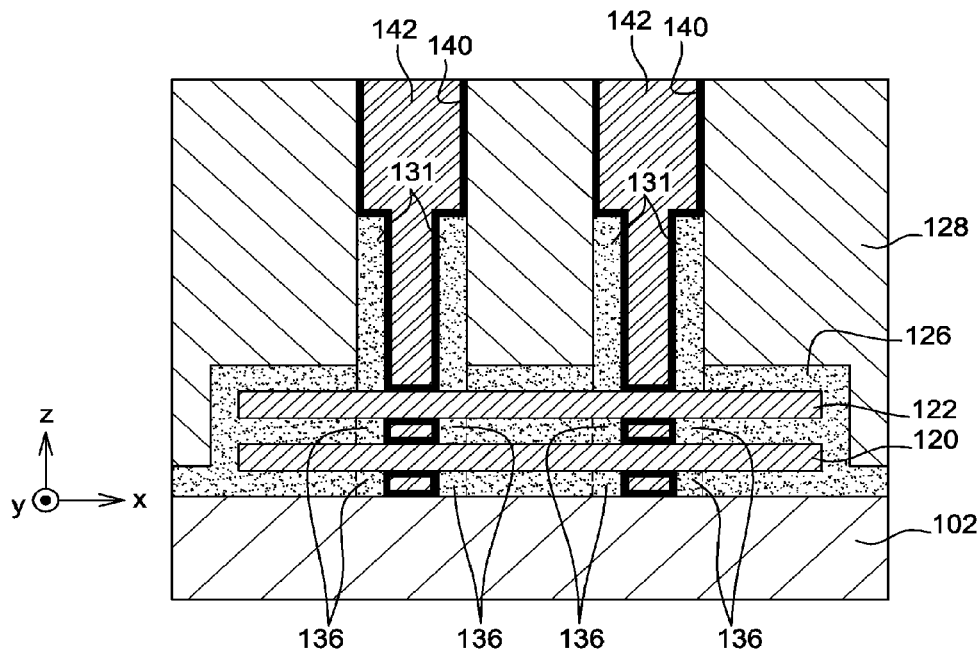

The gates of the transistors 100 are then made by depositing a layer 140 of high permittivity dielectric (more than 3.9 and for example corresponding to $HfO_2$, $ZrO_2$, $TiO_2$, $Al_2O_3$, etc.) in the free spaces 138 and 130, forming gate dielectrics, then a conducting layer 142, for example metallic or comprising polysilicon filling the remaining space (FIG. 12).

Thus, the portions of nanowires 120, 122 forming the channels of transistors 100 are well surrounded by gates, these gates not extending in the source and drain regions of transistors due to precise positioning of the second free spaces 138 delimited by the third portions 136 of the layer 126.

Figure 13:
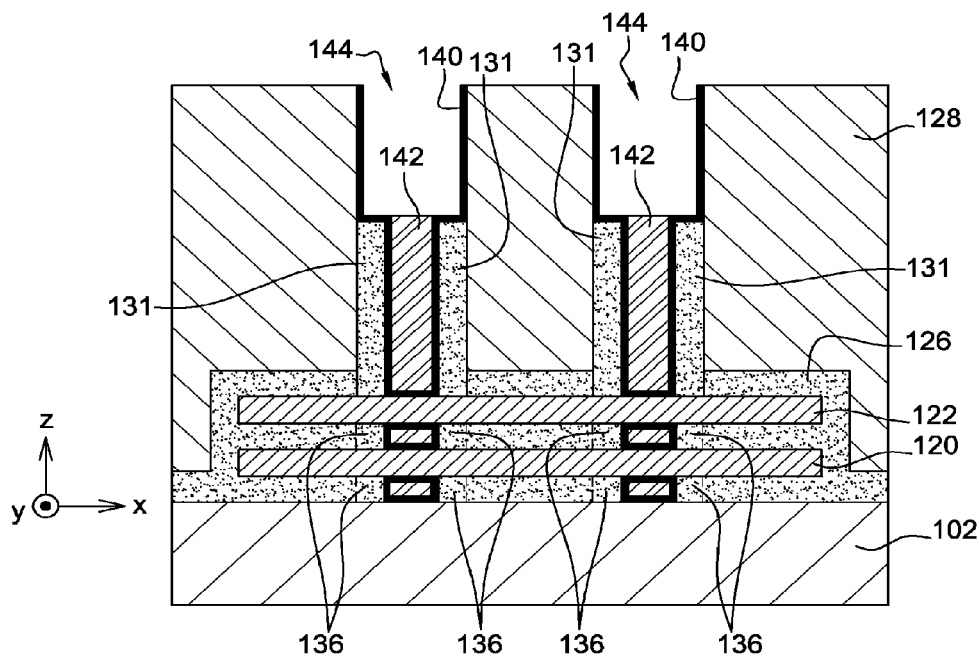

The upper parts of the layers 140 and 142 deposited earlier and than in particular cover the first parts 131 of the layer 126 are then etched until reaching layer 126 (at the tops of the first parts 131) thus forming third free spaces 144 located above the gates of transistors 100 and formed in the layer 128 (FIG. 13).

Figure 14:
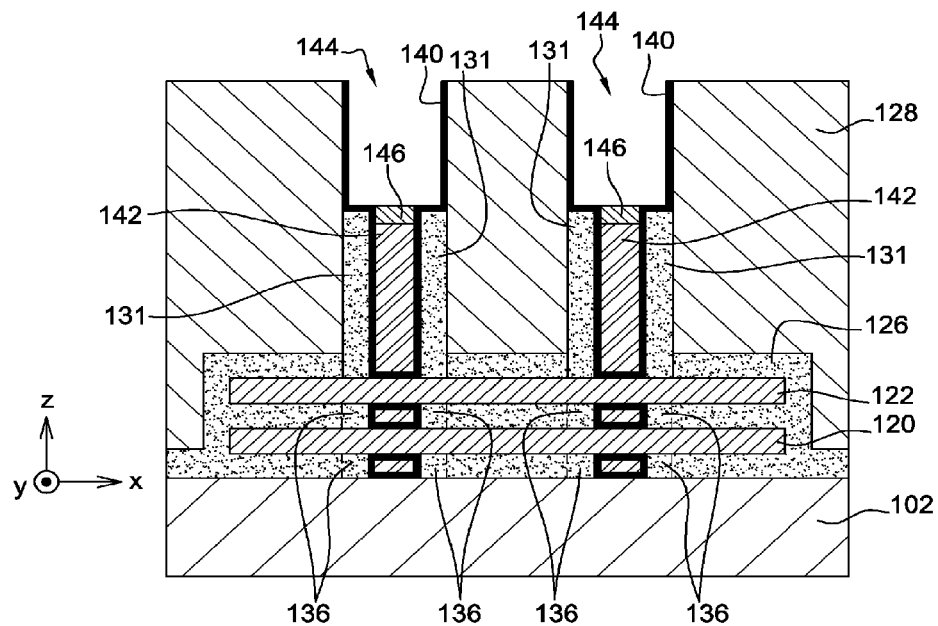

When the conducting material of the gates (layer 142) is polysilicon, this material is then silicided, forming silicided portions 146 that will act as gate electrical contacts (FIG. 14).

Figure 15:
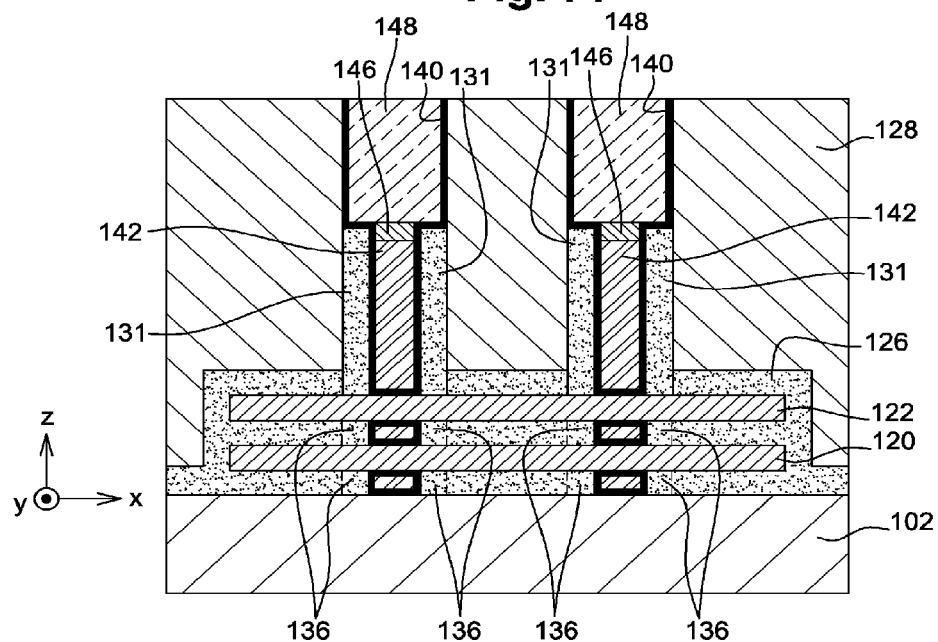

A nitride layer is then deposited in spaces 144. Part of this layer also covers the upper face of the structure made, in other words it also covers layer 128. A CMP is then applied stopping on layer 128, thus forming dielectric portions 148 located in the third free spaces 144 and filling these third free spaces 144 (FIG. 15).

Figure 16:
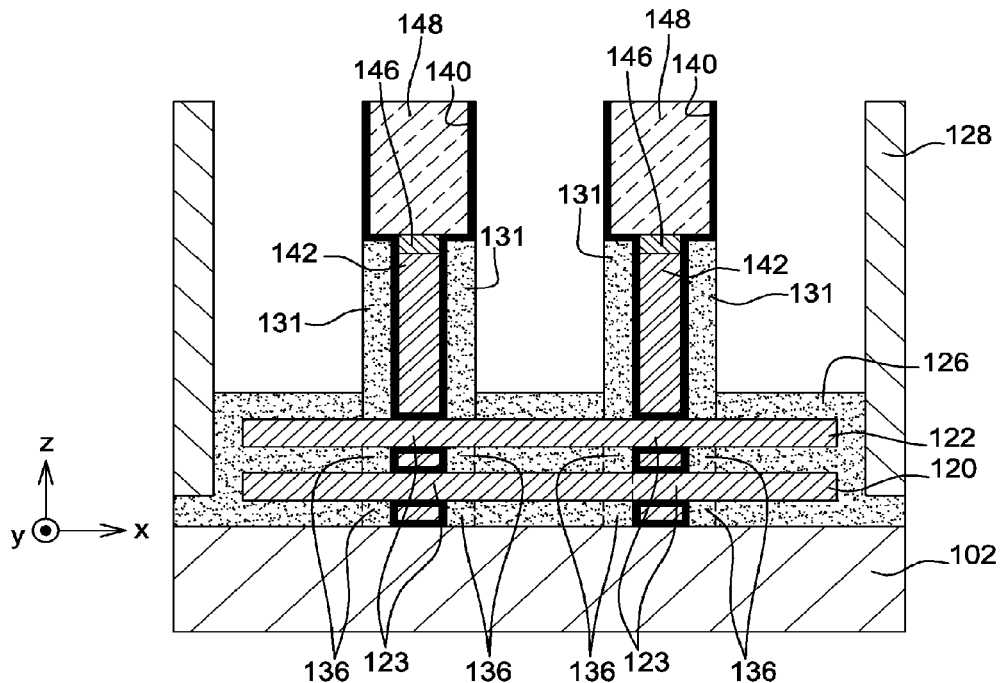

The parts of the layer 128 located above future source and drain regions of the transistors 100 are then eliminated by etching, stopping on layer 126 (FIG. 16).

Figure 17:
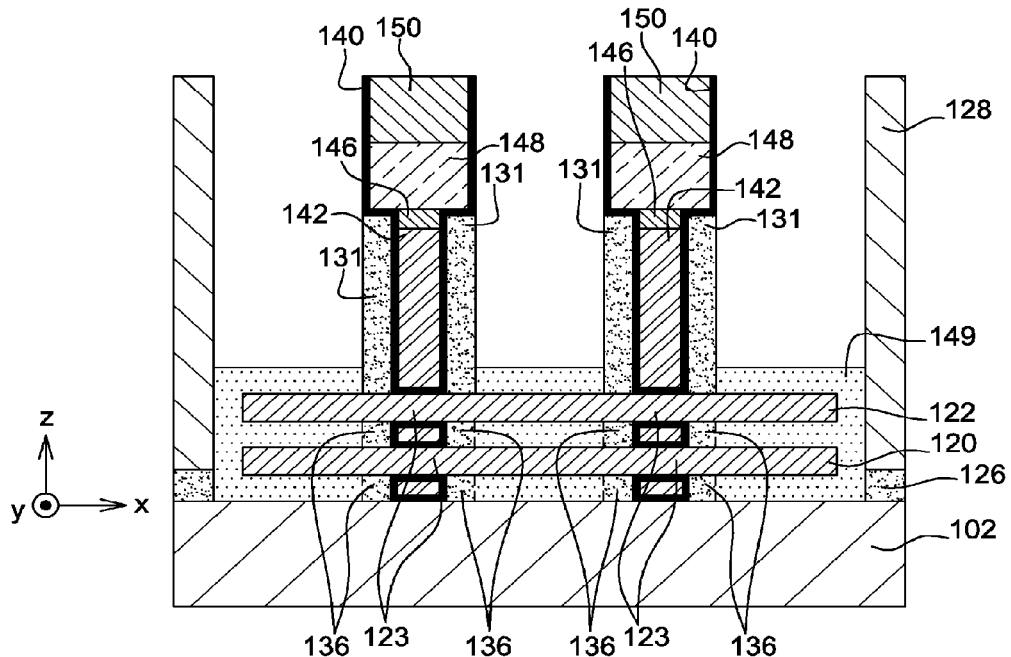

As shown on FIG. 17, all parts of the dielectric layer 126, named fourth parts 149, that are not in line with the dielectric portions 148 or that are not covered by the remaining portions of the layer 128 are then subjected to a second ion implantation, applied in the same manner as the first ion implantation described above with reference to FIG. 10. Thus, the parts of the layer 126 protected by the dielectric portions 148 and therefore that are not modified by the use of this second ion implantation correspond to the third parts 136 and to the first parts 131 of the layer 126 located around the transistor gates 100.

This second ion implantation is carried out such that the ions are implanted in all parts of the layer 126 located at the future source and drain regions of transistors 100, as far as the parts of the layer 126 located between the layer 102 and the first nanowire 120. Since the dielectric portions 148 act as a mask for this ion implantation, the upper parts 150 of portions 148 are also modified by this ion implantation.

Figure 18:
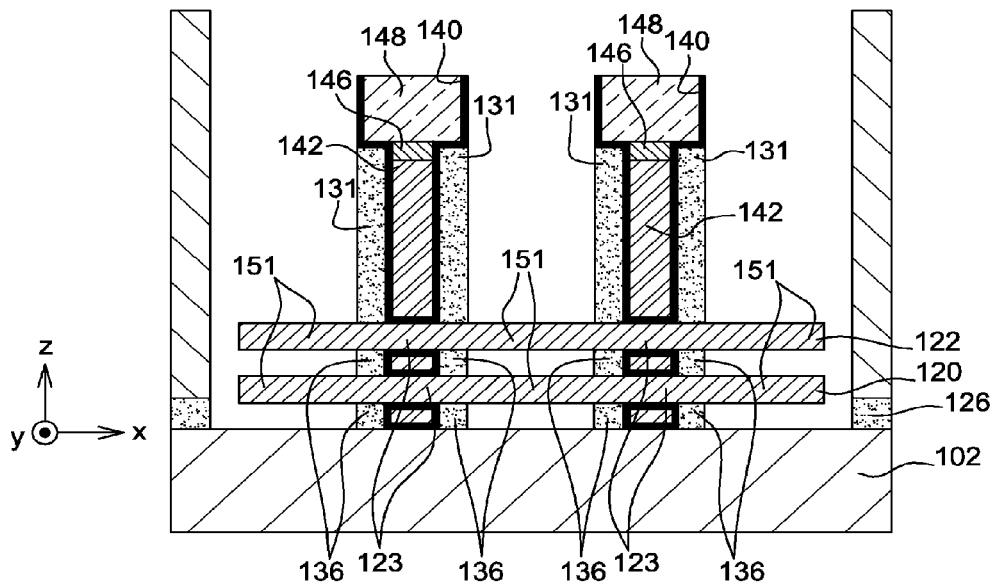

The fourth parts 149 of the dielectric layer 126 modified by this ion implantation are etched selectively relative to parts 131, 136 on which there was no ion implantation, thus releasing spaces around the second portions 151 des nanowires 120, 122 that will be used to make the source and drain regions of transistors 100 (FIG. 18). This etching also eliminates the upper parts 150 of the dielectric portions 148 and the parts of the layer 140 arranged around these upper parts 150.

Figure 19:
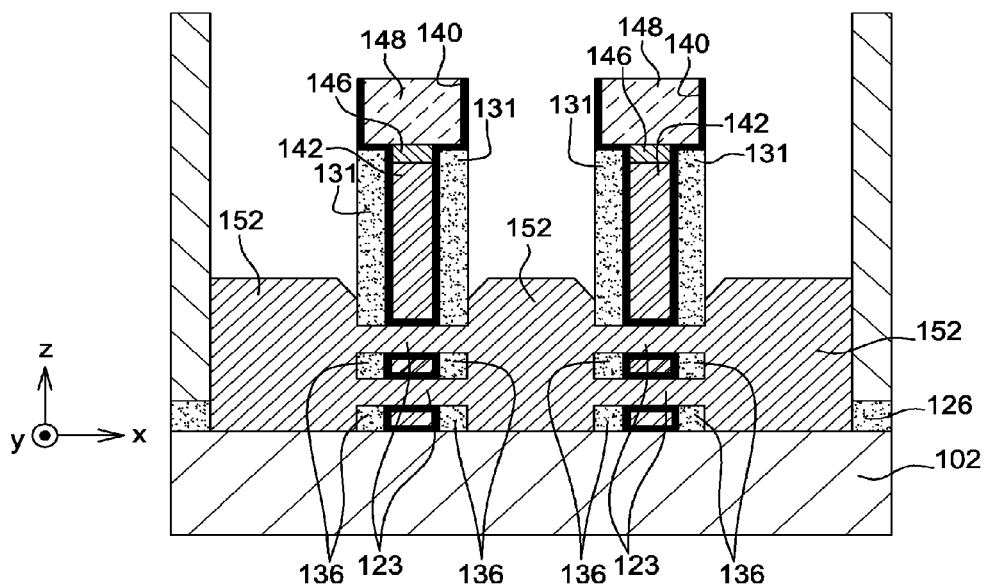

Epitaxy is then applied starting from second portions 151 of nanowires 120, 122 exposed by the previous etching, corresponding to the source and drain regions 152 of the transistors 100. In the example described herein, the source/drain region 152 located between two gates is common to the two transistors 100. The parts of the nanowires 120, 122 on which this epitaxy is not applied are the first portions 123 surrounded by gates and gate spacers formed by the first parts 131 and the third parts 136 of the layer 126 (FIG. 19). This epitaxy increases the volume of semiconductor forming the source and drain regions 152, thus reducing access resistances to transistors 100.

Figure 20:
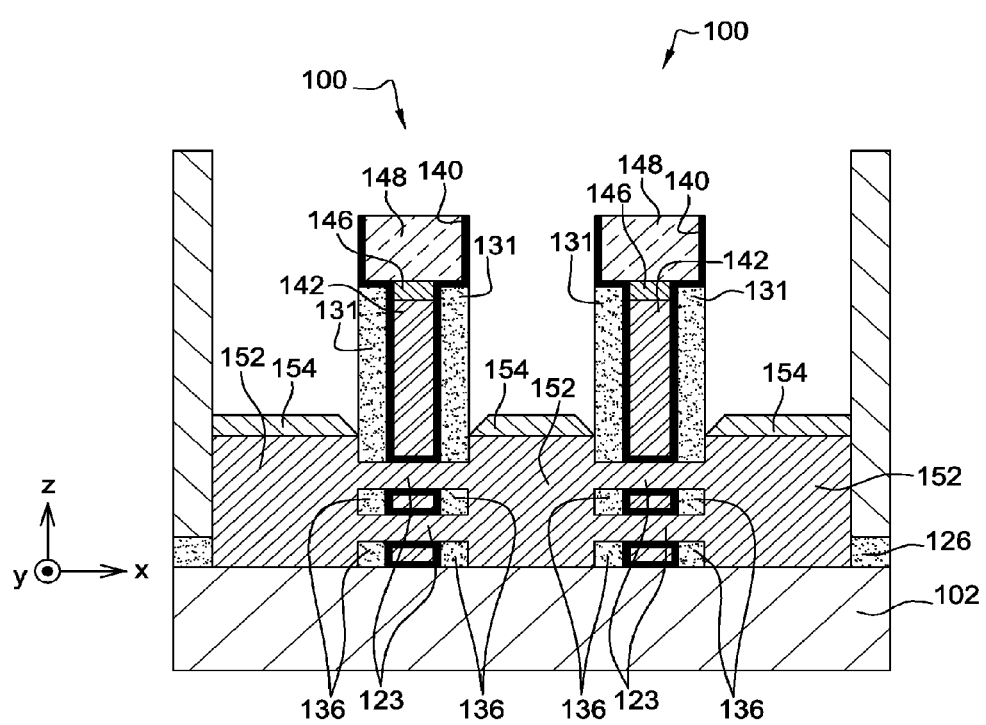

The transistors 100 are completed by siliciding the source and drain regions 152, forming silicided zones 154 to electrically contact these regions 152 (FIG. 20).

The invention claimed is:

1. Method of making at least one transistor with at least one semiconducting nanowire, including at least:
   a) making at least one first semiconducting nanowire on a support, a first portion of the nanowire intended to form part of a transistor channel being partially covered by a dummy gate, the dummy gate and the first nanowire being surrounded by a first dielectric layer, b) removal of the dummy gate, forming a first free space around which first parts of the first dielectric layer are arranged, c) first ion implantation in at least one second part of the first dielectric layer located between the first portion of the first nanowire and the support, the first parts of the first dielectric layer protecting third parts of the first dielectric layer from this first ion implantation, d) selective etching of the second part of the first dielectric layer, forming a second free space, e) making a gate in the first and second free spaces, and a dielectric portion located on the gate and on the first parts of the first dielectric layer, f) second ion implantation in fourth parts of the first dielectric layer surrounding the second portions of the first nanowire intended to form part of the transistor source and drain regions, the dielectric portion protecting the first and third parts of the first dielectric layer from this second ion implantation, g) selective etching of the fourth parts of the first dielectric layer.

2. Method according to claim 1, in which step a) comprises at least:

a1) making a stack of layers on the support, comprising at least one first layer of sacrificial material and at least one second layer of semiconductor material, wherein the sacrificial material is capable of being etched selectively relative to the semiconductor of the second layer, a2) etching the stack of layers, forming at least the first nanowire located on a portion of the sacrificial material, a3) making the dummy gate on the first portion of the first nanowire and in contact with the lateral flanks of the first portion of the first nanowire and of a part of the portion of sacrificial material, a4) etching the portion of sacrificial material, a5) depositing the first dielectric layer around the dummy gate and the first nanowire.

3. Method according to claim 2, in which step a3) comprises at least:

a31) depositing a layer of dummy gate dielectric on the first nanowire and against the lateral flanks of the first nanowire and of the portion of sacrificial material, a32) depositing a layer of dummy gate conducting material covering the layer of dummy gate dielectric, a33) making a mask on the layer of dummy gate conducting material, with a pattern corresponding to the pattern of the dummy gate, a34) etching the layer of dummy gate dielectric and the layer of dummy gate conducting material, according to the pattern of the mask, forming the dummy gate, and in which the first dielectric layer also covers the mask deposited on the dummy gate.

4. Method according to claim 3, also comprising a step between steps a5) and b), to remove part of the first dielectric layer located on the mask, then a step to remove the mask.

5. Method according to claim 1, in which the first dielectric layer surrounding the dummy gate and the first nanowire includes at least one dielectric material with a dielectric permittivity of less than or equal to 7.

6. Method according to claim 1, in which step c) and/or step f) are implemented by dihydrogen-based plasma, or by ion beam comprising argon, fluorine or hydrogen.

7. Method according to claim 6, also comprising, if step c) is implemented with an ion beam, an annealing step to recrystallize the semiconductor of the first portion of the first nanowire and implemented between steps c) and d).

8. Method according to claim 1, also including implementation of the following steps between steps a) and b):

deposition of a second dielectric layer covering the assembly comprising the support, the first nanowire, the dummy gate and the first dielectric layer, planarization of the second dielectric layer stopping on the first dielectric layer, and in which parts of the second dielectric layer covering the fourth parts of the first dielectric layer are removed between the gate making step and the second ion implantation step.

9. Method according to claim 8, in which the dielectric portion is made in a third free space formed in the second dielectric layer.

10. Method according to claim 1, also comprising a siliciding step, when the gate includes polysilicon, to silicide an upper part of the polysilicon of the gate, carried out between steps e) and f).

11. Method according to claim 1, in which implementation of step g) also etches part of the dielectric portion in which ions were implanted during implementation of step f).

12. Method according to claim 1, also comprising, after step g), an epitaxy of the transistor source and drain regions starting from the second portions of the first nanowire, followed by siliciding of the source and drain regions.

13. Method according to claim 1, in which:

step a) also makes at least one second semiconducting nanowire located above the first nanowire and for which a first portion intended to form part of the transistor channel is partially covered by the dummy gate, the first dielectric layer also surrounding the second nanowire, the second part of the first dielectric layer also comprises a portion of the first dielectric layer located between the first and second nanowires, the fourth parts of the first dielectric layer also surround the second portions of the second nanowire intended to form part of the transistor source and drain regions.

14. Method according to claim 1, in which the dummy gate and the gate each comprise several distinct portions separated from each other by a space.

* * * * *